United States Patent
Luu et al.

(10) Patent No.: US 8,022,448 B1
(45) Date of Patent: Sep. 20, 2011

(54) APPARATUS AND METHODS FOR EVAPORATION INCLUDING TEST WAFER HOLDER

(75) Inventors: Lam T. Luu, Moorpark, CA (US); Shiban K. Tiku, Camarillo, CA (US); Richard S. Bingle, Thousand Oaks, CA (US); Jens A. Riege, Ojai, CA (US); Heather L. Knoedler, Newbury Park, CA (US); Daniel C. Weaver, Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 12/898,632

(22) Filed: Oct. 5, 2010

(51) Int. Cl.
*H01L 29/76* (2006.01)

(52) U.S. Cl. ........ 257/288; 257/347; 257/E21.161; 257/E21.169; 257/E21.295; 257/48; 438/674; 438/768; 438/785; 438/240; 438/7

(58) Field of Classification Search .......... 257/48, 257/197, 347, E21.161, E21.169, E21.295; 438/7, 768, 785, 240, 591
See application file for complete search history.

(56) References Cited

U.S. PATENT DOCUMENTS

| 6,592,661 | B1 * | 7/2003 | Thakur et al. ............ 117/2 |
| 2003/0017717 | A1 * | 1/2003 | Ahn et al. ............ 438/768 |

* cited by examiner

*Primary Examiner* — Matthew Smith
*Assistant Examiner* — Wilner Jean Baptiste
(74) *Attorney, Agent, or Firm* — Knobbe, Martens, Olson & Bear, LLP

(57) ABSTRACT

Apparatus and methods for evaporating metal onto semiconductor wafers are disclosed. One such apparatus can include an evaporation chamber that includes a wafer holder, such as a dome, and a test wafer holder that is separate and spaced apart from the wafer holder. In certain implementations, the test wafer can be coupled to a cross beam supporting at least one shaper. A metal can be evaporated onto production wafers positioned in the wafer holder while metal is evaporated on a test wafer positioned in a test wafer holder. In some instances, the production wafers can be GaAs wafers. The test wafer can be used to make a quality assessment about the production wafers.

13 Claims, 9 Drawing Sheets

APPARATUS AND METHODS FOR EVAPORATION INCLUDING TEST WAFER HOLDER

BACKGROUND

1. Field

The disclosed technology relates to systems for processing semiconductor substrates and, in particular, to systems for evaporating metal onto semiconductor substrates.

2. Description of the Related Art

Processing of semiconductor substrates, such as GaAs wafers, may include depositing a relatively thin film of metal onto the substrates by evaporation. Evaporation may be accomplished by heating a metal source and having the resulting metal vapor travel through a vacuum onto the substrate. The metal vapor may then condense on the substrate to produce a thin film of metal. The thin film may be used for a variety of purposes, such as serving as a contact for a collector, a base, and/or an emitter of a bipolar transistor.

While manufacturing wafers that will be used to make production parts, a test wafer may also be processed in order to make a quality assessment associated with the production parts and/or to ensure that processes, such as evaporation, were carried out within acceptable bounds. Small changes in environment may noticeably impact performance and/or reliability of end products produced from semiconductor wafers. Thus, the test wafer can be positioned in tools, such as an evaporator, so that the test wafer can be exposed to substantially the same processing environment as production wafers. As wafer diameter increases, fewer wafers can be positioned within the same amount of space. This leaves less space for test wafers, which may take away valuable space from production wafers.

While evaporation onto substrates takes place, sensors, such as crystal monitor sensors, may monitor conditions of evaporation. For example, a crystal monitoring system can detect a deposition rate and/or thickness of metal deposited onto the substrate. For accurate measurements, the crystal monitor sensor may be positioned near the production wafers so that the crystal monitor is exposed to substantially the same environment as the production wafers within an evaporation chamber. Information obtained using the crystal monitor sensor may be used to stop evaporation and prevent additional metal from being deposited onto the substrates.

SUMMARY OF CERTAIN INVENTIVE ASPECTS

The apparatus and methods described in the claims each have several aspects, no single one of which is solely responsible for its desirable attributes. Without limiting the scope of this invention, some prominent features will now be briefly discussed.

One aspect of the disclosure is a semiconductor processing apparatus that includes a wafer holder, a test wafer holder, and a heat source. The wafer holder can be configured to hold a plurality of wafers, and the wafer holder can be positioned within a chamber. The test wafer holder, which can be configured to hold a test wafer, can be positioned within the chamber separate and spaced apart from the wafer holder. The heat source can be configured to heat a metal source so as to evaporate metal within the chamber onto a plurality of semiconductor wafers positioned in the wafer holder and a test wafer positioned in the test wafer holder.

According to certain implementations, the wafer holder is configured to hold at least one GaAs wafer having a diameter of at least about 150 mm. In some implementations, the test wafer holder is configured to hold a wafer having a thickness of no greater than about 800 μm.

In accordance with various implementations, the apparatus can also include a shaper supported by a cross beam, wherein the test wafer holder is coupled to the cross beam. In some of these implementations, the test wafer holder is positioned between the material being evaporated and the shaper. The test wafer holder can include a top and a bottom portion spaced by a plurality of posts, the bottom porting having a hole surrounded by a ridge, the ridge configured to hold the test wafer in accordance with certain implementations.

According to a number of implementations, the wafer holder may include a dome. In some instances the dome is configured to rotate.

According to several implementations, the metal source includes at least one of gold, gold germanium alloy, platinum, titanium, nickel, and copper. In various implementations, the apparatus is configured to process at least one GaAs wafer including at least a portion of a HBT device. In some of these implementations, apparatus is configured to process at least one GaAs wafer including at least a portion of a BiFET device. The apparatus can also be configured to process at least one semiconductor wafer including at least a portion of at least one of a varactor, a gain block, and a pseudomorphic high electron mobility transistor (pHEMT) device.

According to some implementations, the apparatus can also include a crystal monitor configured to detect metal vapor associated with a metal source prior to a portion of metal from the metal source being deposited on at least one wafer in the chamber; and a shutter configured to remain in a closed position in response to the crystal monitor detecting a condition, so as to prevent metal deposition on one or more wafers in the chamber.

Another aspect of the disclosure is a method of processing a semiconductor wafer. The method includes providing a chamber including: a dome configured to hold a plurality of wafers including the semiconductor wafer, and a test wafer holder separate from the dome; heating a metal source so as to evaporate metal from the metal source within the chamber; and evaporating metal onto a semiconductor test wafer positioned in the test wafer holder, while evaporating metal onto the semiconductor wafer positioned in the dome.

In some instances, the semiconductor wafer is a GaAs wafer. A diameter of the semiconductor wafer is at least about 150 mm in certain instances. And in various instances at least a portion of the metal evaporated onto the GaAs wafer is configured to function as a contact on a HBT device for at least one of a collector, a base, and an emitter. In a number of instances, the test wafer is a Si wafer.

In accordance with some implementations, the test wafer holder is attached to a cross beam supporting a shaper, and wherein the shaper has a footprint about at least as large as a footprint of test wafer holder in the path metal vapor travels between the metal source and the semiconductor wafer positioned in the dome.

According to some implementations, the method also includes detecting a condition related to metal evaporation using a crystal monitor; and keeping a shutter in a closed position in response to detecting the condition, so as to prevent metal deposition of the metal source onto the GaAs wafer and the test wafer in the chamber.

One more aspect of the disclosure is a method of processing a GaAs wafer. The method includes providing an evaporation chamber including a dome having slots configured to hold a plurality of wafers having a diameter of at least about 150 mm, and a test wafer holder configured to hold at least one test wafer, the test wafer holder spaced apart from the dome; positioning the GaAs wafer in a slot of the dome; applying an energy source to a metal source, so as to evaporate metal from the metal source within the evaporation chamber; and depositing a thin film of metal from the metal source onto the GaAs wafer, the GaAs including at least a portion of at least one of a BiFET device, a varactor, a gain block, and a pseudomorphic high electron mobility transistor (pHEMT) device.

Another aspect of the disclosure is a semiconductor processing apparatus. The apparatus includes an energy source, a wafer holder, a crystal monitor sensor, and a shutter. The energy source is configured to heat a metal source so as to evaporate at least a portion of the metal source. The wafer holder is configured to hold at least one semiconductor wafer, the wafer holder positioned in an evaporation chamber. The crystal monitor sensor is configured to detect metal vapor associated with the metal source prior to a portion of metal from the metal source being deposited on the at least one semiconductor wafer. In addition, the shutter configured to remain in a closed position, in response to the crystal monitor sensor detecting a condition, so as to prevent metal deposition on the at least one semiconductor wafer.

In a number of implementations, the semiconductor wafer is a GaAs wafer. In some of these implementations, the wafer holder is configured to hold the GaAs wafer having a thickness of no greater than about 800 μm.

According to various implementations, the apparatus also includes another crystal monitor sensor configured to monitor conditions within the evaporation chamber during metal deposition onto the at least one semiconductor wafer, wherein the shutter is configured to close in response to the another crystal monitor sensor detecting that a thin film of a predetermined thickness has been deposited onto the at least one semiconductor wafer. In some implementations, the shutter is configured to remain closed only if the crystal monitor sensor detects the condition. In some implementations, the wafer holder is configured to hold a wafer having a diameter of at least about 150 mm.

In accordance with a number of implementations, the condition is indicative of a composition of the metal source. According to a number of implementations, the shutter is configured to open only if the crystal monitor detects a predetermined metal source. In various implementations, the crystal monitor sensor is configured to detect a plurality of metal sources based at least in part on an input associated with each of the plurality of metal sources. In certain implementations, the condition is indicative of a position of the metal source within a crucible.

Yet another aspect of the disclosure is a method of processing a GaAs wafer. The method can include heating a metal source within an evaporation chamber. The method can also include detecting an undesired condition for metal evaporation using a crystal monitor sensor. In addition, the method can include keeping a shutter in a closed position in response to detecting the undesired condition, so as to prevent at least a portion of the metal source to be evaporated on the GaAs wafer in the evaporation chamber. A thin film of metal from the metal source can be evaporated onto the GaAs wafer according to the method.

In some implementations, the undesired condition is associated with an evaporation rate of the metal source. According to a number of implementations, the undesired condition is associated with an impurity level of the metal source. In accordance with various implementations, the undesired condition is associated with a particular metal source used to form a contact on at least one of a collector, a base, and an emitter on a heterojunction bipolar transistor (HBT) device on the GaAs wafer.

The shutter is configured to remain in a closed position only if the crystal monitor sensor does not detect the particular metal source according to some instances. The undesired condition is associated with a position of the metal source in a number of instances.

In some implementations, the method also includes detecting a second condition associated with depositing a suitable thin film on the GaAs wafer with another crystal monitor sensor; and closing the shutter in response to detecting the second condition.

The GaAs wafer has a diameter of at least about 150 mm in various instances. The GaAs wafer includes at least a portion of a bipolar field effect transistor (BiFET) device according to some implementations. In addition, the shutter is configured to substantially prevent evaporation of the metal source onto the GaAs wafer when the shutter is in a closed position in a number of implementations.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 12/898,616 titled "APPARATUS AND METHODS FOR DETECTING EVAPORATION CONDITIONS," filed on even date herewith and is hereby incorporated by reference herein in its entirety.

DETAILED DESCRIPTION OF CERTAIN EMBODIMENTS

The headings provided herein, if any, are for convenience only and do not necessarily affect the scope or meaning of the claimed invention.

Provided herein are various methodologies and devices for processing wafers such as semiconductor wafers. In the description herein, various examples are described in the context of GaAs substrate wafers. It will be understood, however, that some or all of the features of the present disclosure can be implemented in processing of other types of semiconductor wafers. Further, some of the features can also be applied to situations involving non-semiconductor wafers.

In the description herein, various examples are described in the context of front-side processing of wafers. It will be understood, however, that some or all of the features of the present disclosure can be implemented in back-side processing of wafers.

Figure 1:
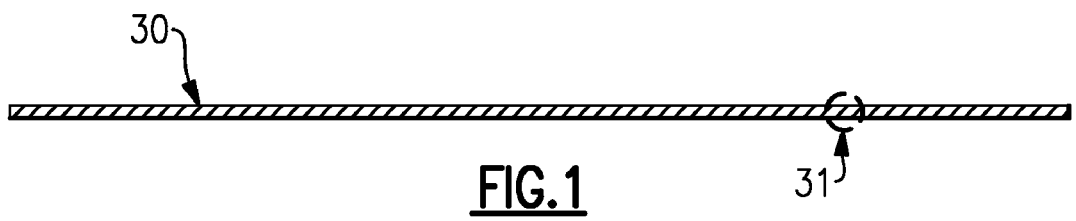
FIG. 1 depicts a side view of a wafer.

FIG. 1 depicts a side view of a wafer 30 having first and second sides. The first side can be a front side, and the second side a back side. The wafer 30 can have substantially circular major surfaces. In certain implementations, the wafer 30 can have a diameter of approximately 100 mm, 150 mm, 200 mm, 300 mm, or greater. By way of an example, a 150 mm (also referred to as "6-inch") GaAs substrate can have a thickness ranging from approximately 600 µm to 800 µm in some instances.

Figure 2:
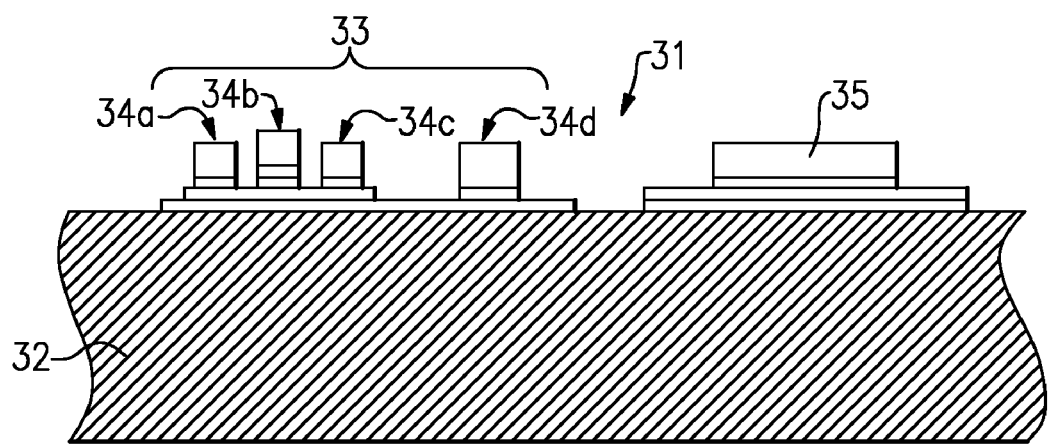
FIG. 2 depicts an enlarged view of a portion of the wafer of FIG. 1.

FIG. 2 depicts an enlarged view of a portion 31 of the wafer 30 of FIG. 1. The wafer 30 can include a substrate layer 32 (e.g., a GaAs substrate layer). The wafer 30 can further include a number of features formed on or in its front side. In the example shown, a transistor 33 and a metal pad 35 are depicted as being formed the front side. The example transistor 33 is depicted as having an emitter 34b, bases 34a, 34c, and a collector 34d. Although not shown in the figure, the circuitry can also include formed inductors, capacitors, and source, gate, drain necessary for planar Field Effect Transistors. Such structures can be formed by processing on epitaxial layers that have been deposited on the substrate layer.

Overview of Evaporators

A thin film of metal can be deposited by evaporation onto one or more wafers as part of a process that may generally be referred to as "evaporation." In some instances, this metal deposition can be part of a front side process for wafers that include at least a portion of a transistor device, for example, a heterojunction biopolar transistor (HBT) device. For instance, the transistor 33 illustrated in FIG. 2 may be a HBT. In some instances, the end product of processing the GaAs wafer can include at least one bipolar field effect transistor (BiFET) device. While the description herein may refer to a GaAs process, the features described herein could apply to any type of semiconductor process that includes evaporation. For example, evaporation processes associated with gain blocks and varactors, pseudomorphic high electron mobility transistors (pHEMT), light emitting diodes (LEDs), solar cells, or any other semiconductor structures on a semiconductor substrate could implement any combination of features described herein associated with evaporation. By way of example, a semiconductor substrate can include a GaAs substrate or a Si substrate.

A metal source in an evaporator can be heated by an energy source by a number of methods, such as a thermal method, an electron-beam method, a flash evaporation method, and/or a resistive evaporation method. Although the following description may refer to a particular energy source, any combination of the features described herein may be implemented with any energy source associated with evaporation known in the art. The energy source can evaporate the metal source, thereby creating a metal vapor. A vacuum, which may be created by a vacuum pump, can allow the resulting vapor particles to travel directly to a deposition target, which may be on a GaAs wafer. The evaporated metal may condense on the substrate to produce a thin film.

Figure 3:
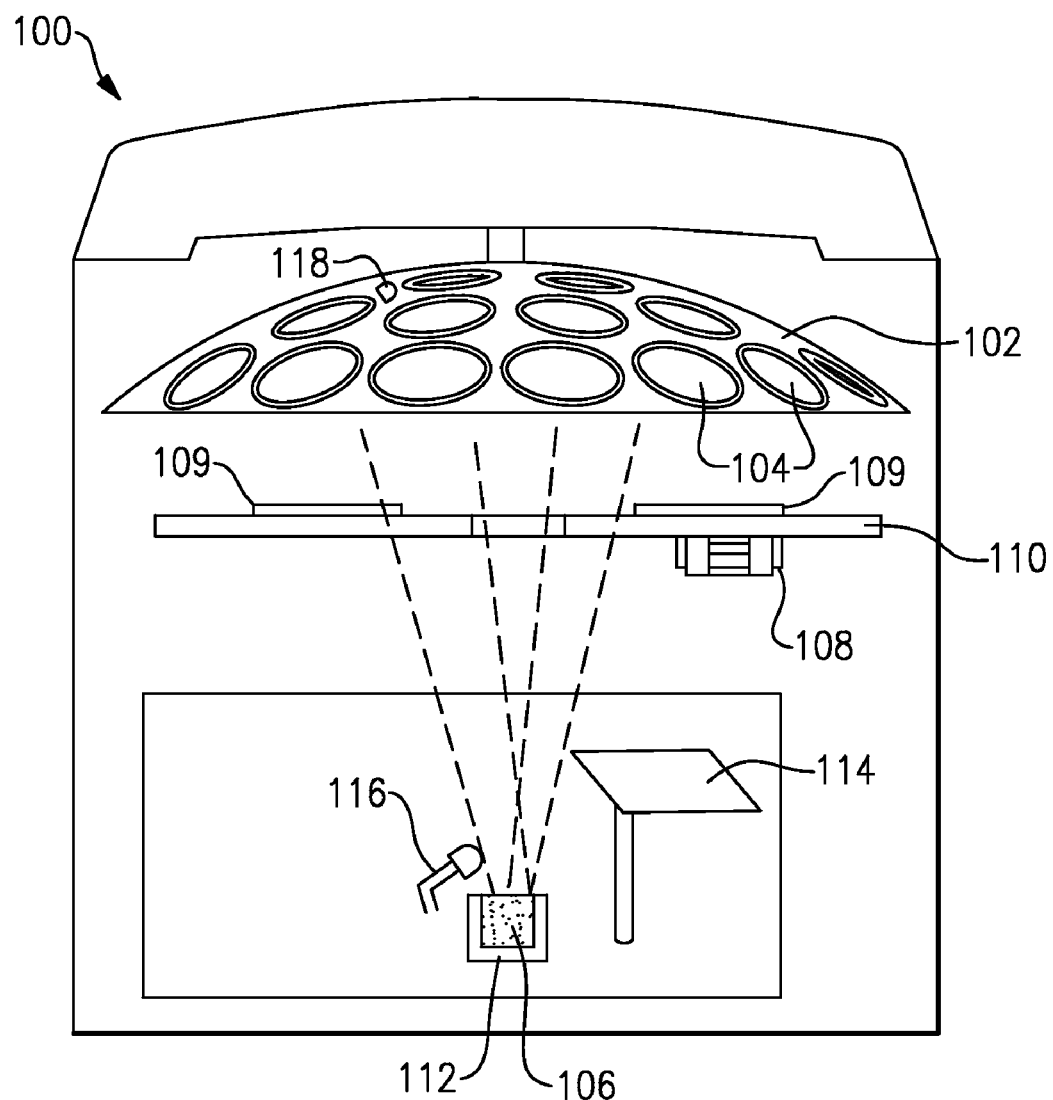
FIG. 3 illustrates an evaporator for depositing metal onto a plurality of substrates, such as wafers, according to one embodiment.

FIG. 3 illustrates an evaporator 100 suitable for evaporating metal onto a plurality of substrates, such as wafers, according to one embodiment. Advantageously, the evaporator 100 may be used in processing any type of semiconductor wafer, for example, as described earlier. In one particular instance, the wafer includes HBT devices, which, in some instances, can be BiFET devices. For example, the evaporator 100 may be used to evaporate metal over one or more epitaxial layers of a bipolar transistor. In some instances, the evaporator 100 may be used to deposit a thin film of metal over at least a portion a collector, a base, an emitter and/or a gate area of a BiFET device. In the example provided in FIG. 2, the contacts may correspond to a top portion of the collector 34d, the base 34a, 34c and/or the emitter 34b on the front side of the wafer 30. Alternatively or additionally, the evaporation may be used to form metal interconnects. The evaporator 100 may also be used for providing contacts for the gate, source, and/or drain of a pHEMT, for providing contacts for solar cells, and/or for other applications.

Titanium, platinum, gold, gold germanium alloy, nickel, copper, aluminum, tantalum, tungsten, palladium, iridium, antimony, beryllium, cadmium selenide, cadmium telluride, chromium, gallium antimonide, gallium arsenide, gallium nitride, gallium manganese arsenide, indium, indium phosphide, indium telluride, iron, magnesium, molybdenum, permalloy, scandium, silicon, silver, supermalloy, nickel vanadium and/or other thin films may be deposited onto a wafer using the evaporator 100.

A metal vapor can be created by applying energy to a metal source 106 in a crucible 112. A shutter 114 can open so as to allow evaporation of at least a portion of the metal source 106 into the evaporation chamber and deposit a thin film on one or more wafers. The shutter 114 may open based on the recipe on the tool. Different metal sources may be used in the evaporator for different process steps. The shutter 114 may close in response to a first crystal monitor sensor 118 detecting one or more predetermined conditions within the evaporation chamber. An example of such a condition may include the first crystal monitor sensor 118 detecting that a film of metal of a predetermined thickness has been deposited on one or more wafers. However, the shutter 114 can block the evaporation stream to a first crystal monitor sensor 118 when in a closed position. A second crystal monitor sensor 116 can monitor evaporation conditions when the shutter 114 is in the closed position. Software in a crystal monitoring system may be configured to prevent the shutter 114 from opening (e.g., by tool alarming) if there is a problem is detected. Some example problems include no metal source 106 or an undesired metal source 106 in the crucible 112. On the other hand, if the metal source 106 is in place and undesired conditions are not detected, the shutter 114 may open based on the recipe. More detail regarding the monitoring crystal sensors 116, 118, the crucible 112, and the shutter 114 will be provided later in connection with FIGS. 7 and 8.

An evaporation chamber of the evaporator 100 may include a wafer holder, such as a dome 102, configured to hold a plurality of wafers. While the following description may reference a dome shaped wafer holder, other wafer holders may be used in other embodiments. In some instances, the dome 102 may be comprised of stainless steel. And in some implementations, the dome 102 may be configured to rotate. The dome 102 may include a plurality of slots 104 configured to hold wafers. In some embodiments, the slots 104 may be configured to hold wafers having a diameter of about 6 inches or greater. Each slot 104 may include a hole sized to expose a major surface of each wafer to vapor particles emitted from the metal source 106. Around the circumference of a hole, the slot 104 may also include a lip or ridge configured to secure a wafer in place.

With advances in technology, larger wafers may be used in semiconductor manufacturing processes, such as the processes described above in reference to FIGS. 1 and 2. For example, 6-inch wafers may be processed instead of 4-inch wafers. The same manufacturing facility used to process previous wafers may be converted to process larger wafers, as manufacturing facilities are very expensive to build and time consuming to set up for production. Part of the conversion to modify a manufacturing facility for production of larger wafers may include modifying existing tools in the manufacturing facility, such as a wafer holder in an evaporator, to accommodate a larger wafer size. For example, slots in a dome may be sized to hold fewer larger wafers. By modifying existing tools, substantial costs associated with new equipment and modification of the manufacturing facility may be avoided.

As the size of wafers increases, the number of wafers that can be held in a wafer holder of a fixed size, such as the dome 102, decreases. For example, a dome with slots for 42 individual 4-inch wafers may only be able to hold 18 6-inch wafers because the corresponding surface area of 19 6-inch wafers is greater than 42 4-inch wafers. Equipment limitations may make it difficult to increase the number of wafers held in a dome of fixed size. The reduced number of slots to hold wafers may lead to undesirable results. For instance, evaporating metal onto fewer wafers can reduce evaporator capacity. This can impact the capacity of the entire production flow, particularly when the dome 102 can hold less than a multiple of the number of wafers that are processed in a previous processing step plus a test wafer.

The number of wafers held by a wafer holder can be related to processing steps other than evaporation. Processing steps may process a group of wafers in a wafer lot that includes a predetermined number of wafers. In some instances, the wafer lot may include 20 wafers. While processing a lot, it can be desirable to also process a test wafer, which may also be referred to as a "witness wafer." The test wafer can be used to measure a number of parameters, in order to monitor product quality of each production run. For instance, the test wafer can be used to measure parameters related to thickness, sheet resistance, uniformity of the metal deposited, stress, and/or particles evaporated (e.g., to check for a clump of metal particles sometimes referred to as a "nodule"). Parameter values measured from the test wafer may be used to help keep tight control of particles and/or monitor any deviations from the norm can help ensure that products with reliability issues are not shipped to customers. Some reliability issues may relate to the reliability of standard capacitors and/or stacked capacitors in an end product.

Test Wafer Holder

Conventionally, a test wafer has been placed in the dome 102 of the evaporator 100 so that the test wafer can be exposed to substantially the same environment as production wafers. The environment inside the evaporator 100 is tightly controlled, and minor changes in position of a wafer and/or components can affect the results of evaporation onto the wafer. As a result, it may be advantageous to position a test wafer so that the test wafer will have characteristics, such as the parameters described herein, that strongly correlate with production wafers. In some instances, it may be desirable for the test wafer to be substantially the same size as the production wafers so that the test wafer may see a number of the same effects related to wafer size as the production wafers. In other instances, it may be sufficient for the test wafer to be smaller than the production wafer because the measured parameters may be adequate for determining reliability. For example, a 4-inch test wafer may be used with 6-inch production wafers, in some implementations.

If a sufficient number of slots 104 are not included in the dome 102 to fit at least one wafer lot and a test wafer, the evaporator capacity may decrease. For example, if there are 20 slots 104 in the dome 102, the evaporator 100 may have a capacity reduced by 5% if 19 production wafers out of a wafer lot of 20 wafers, along with 1 test wafer, are positioned within the slots 104 of the dome 102 during evaporation. Preventing a decrease in evaporator capacity can have a significant impact on the production process. For example, preventing a 5% decrease in evaporator capacity may make purchasing an additional evaporator, which may cost more than $750,000, unnecessary. Moreover, it may be logistically difficult to find clean room space and appropriate facilities for an additional evaporator. In addition, this clean room space may come at the expense of another tool used in another processing step. As another example, significant cost avoidance in precious metal costs may be realized by preventing a 5% decrease in evaporator capacity.

An alternative approach to positioning the test wafer within the evaporation chamber is illustrated in FIG. 3. A test wafer holder 108 is included in the evaporation chamber separate and spaced apart from the wafer holder, which is the dome 102 in the illustrated embodiment. In this way, an evaporator with a wafer holder that can hold only the number of wafers in a wafer lot can run at full capacity by positioning the test wafer in the evaporation chamber separate from the wafer holder. Advantageously, positioning the test wafer in a separate wafer holder enables each slot 104 in the dome 102 to be used by production wafers. More details regarding test wafer holders will be provided later in connection with FIGS. 4, 5A and 5B.

As illustrated in FIG. 3, the test wafer holder 108 is coupled to a cross beam 110 at a location below a shaper 109. The shaper 109 and the cross beam 110 may be made of metal, such as stainless steel. The shaper 109 may positioned within the evaporation chamber between the metal source 106 and the dome 102, in order to improve the uniformity of metal deposited on one or more of the wafers held in slots 104 of the dome 102. The shaper 109 can block a portion of the metal vapor traveling between the metal source 106 and wafers in the dome 102, while the dome 102 rotates during evaporation. This can result in thin films with greater uniformity being deposited on at least one wafer positioned in the dome 102 during evaporation.

Figure 4:
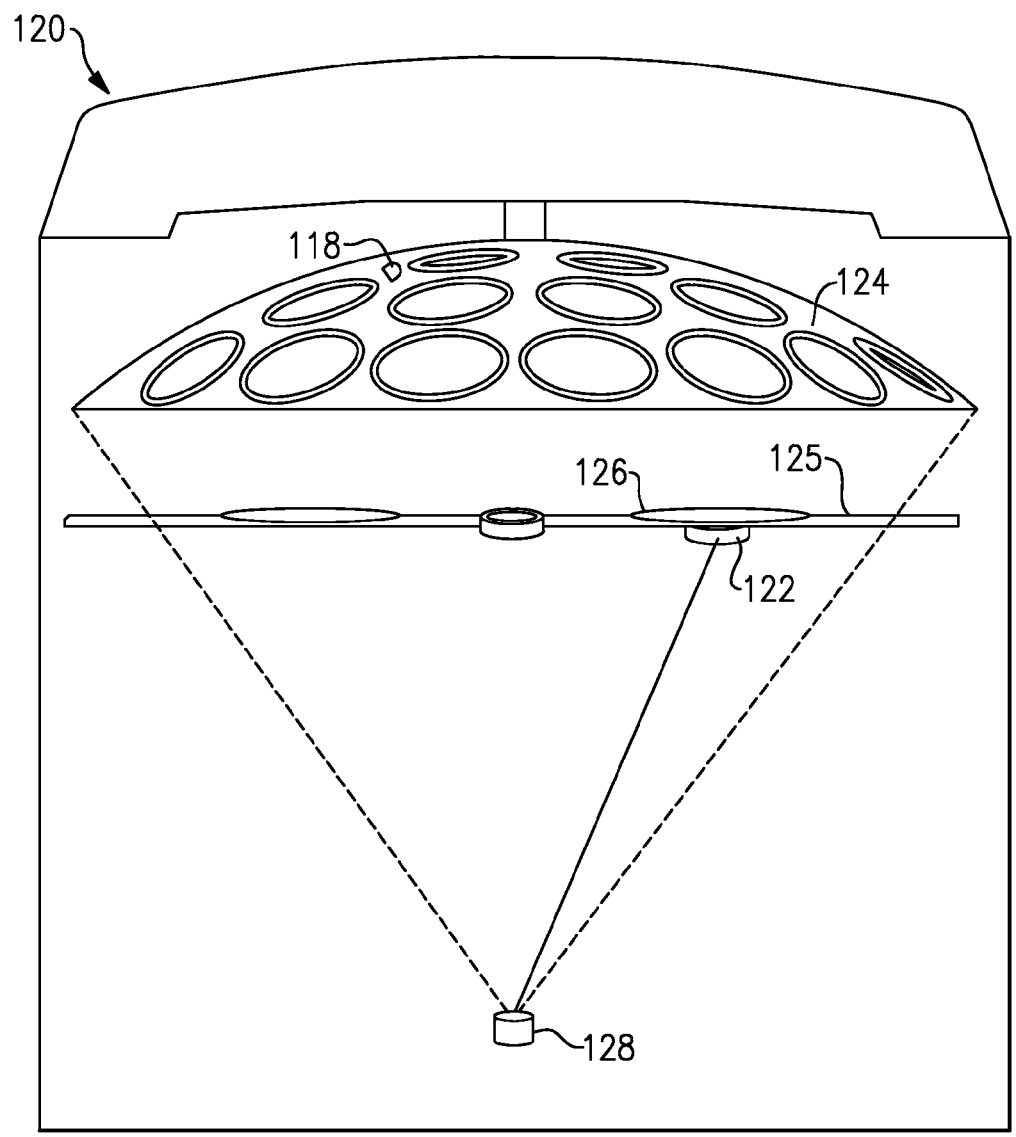
FIG. 4 illustrates an evaporator including a test wafer holder separate from a wafer holder according to another embodiment.

Referring to FIG. 4, an evaporator 120 including a test wafer holder 122 separate and spaced apart from a wafer holder 124 according to another embodiment is provided. Any combination of features of the evaporator 120 may be implemented in connection with the evaporator 100. While one test wafer holder 122 is shown in FIG. 4, more than one test wafer holder 124 may be included in other embodiments.

As illustrated in FIG. 4, the test wafer holder 122 is attached to a cross beam 125 below a major surface of a shaper 126 between a metal source 128 and the wafer holder 124. The test wafer holder 122 may be attached to the cross beam 125 below the major surface of the shaper 126 that is closest in distance to the metal source 126. In other embodiments (not illustrated), a second test wafer holder may be attached to the cross beam 125 on the opposite side of the evaporation chamber. The second test wafer holder may include any combination of features described in connection with the test wafer holder 122. Attaching the test wafer holder 122 to the cross beam 125 can provide a relatively sturdy, repeatable platform that may ensure that a test wafer is consistently positioned in the test wafer holder 122 over time.

The test wafer holder 122 may be sized such that the test wafer holder 122 does not interfere with the path of the vapor from the metal source 128 to the wafer holder 124. At the same time, a test wafer positioned in the test wafer holder 122 may be in the direct path of the vapor from the metal source 128, which may make it more likely that a relatively good correlation can be found between the characteristics of a test wafer and characteristics of a production wafer. These features of the test wafer holder 122 may be implemented by sizing a major surface of the test wafer holder 122 such that it has a footprint that is no greater than a footprint of the shaper 126 in a direction substantially parallel to a bottom and/or a top of the evaporation chamber, in some embodiments. In other embodiments, the footprint of the test wafer holder 122 may be larger than the footprint of the shaper in the path metal vapor travels from the metal source 128 to wafers positioned in the wafer holder 124.

In addition, whether or not the test wafer holder 122 includes a test wafer may not impact the uniformity of thin film metal deposition onto wafers held in slots of the wafer holder 124, since the shaper 126 will block metal vapor if the test wafer holder 122 does not include a test wafer.

A wafer positioned in the test wafer holder 122 and another wafer positioned in the wafer holder 124, which can be dome shaped, may be different distances from the metal source 128. For instance, a distance from a test wafer in the test wafer holder 122 to the metal source 128 may be approximately 750 mm to 1500 mm and a distance from a wafer in the wafer holder 124 to the metal source 128 may be approximately 625 mm to 1250 mm.

The different distances from the metal source may result in differences in thin films of metal deposited on these wafers, which may in turn result in different values for parameters that may be used to monitor the quality of wafers in a production run, for example, as described above. In some instances, the differences in parameter values for a wafer positioned in the test wafer holder 122 during evaporation and another wafer positioned in the wafer holder 124 during evaporation may be scaled to account for the difference in distance from the metal source 128. For example, the sheet resistance can be scaled by a geometric factor that takes into account the difference in distance between the test wafer holder 122 and the wafer holder 124 using similar triangles.

Figure 5A:
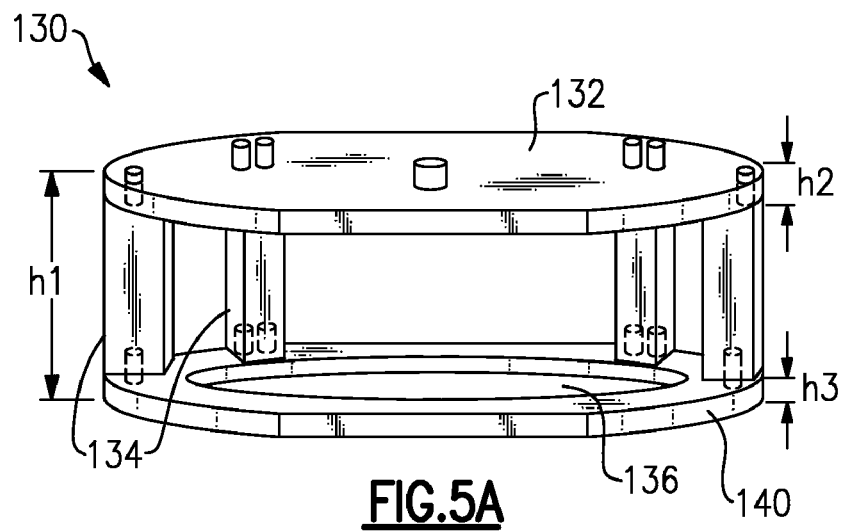
FIGS. 5A and 5B show an example test wafer holder design according to one embodiment.
Figure 5B:
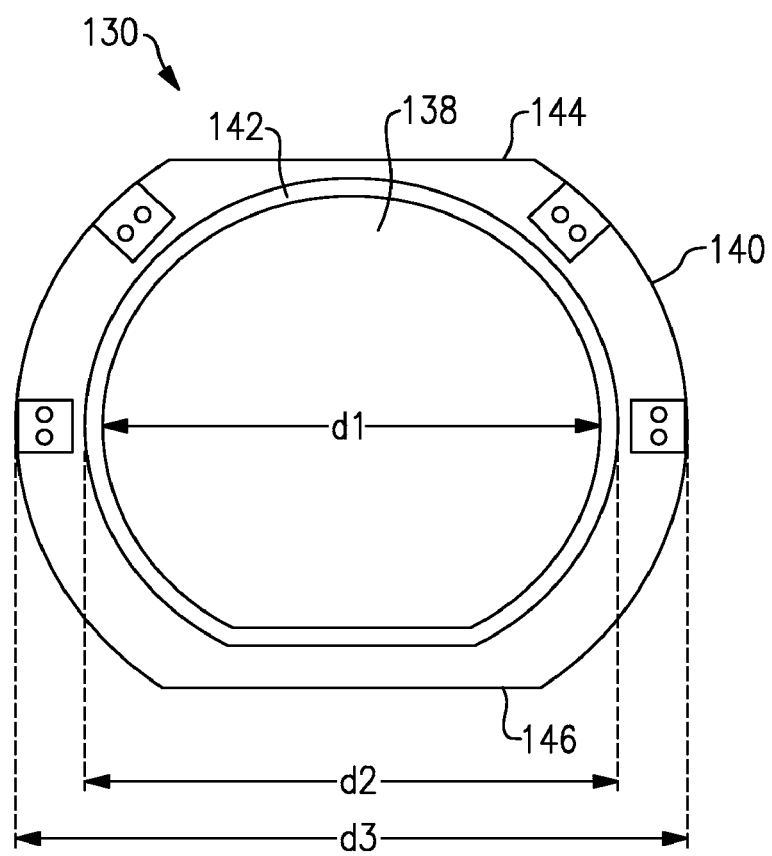

FIGS. 5A and 5B provide an example design of a test wafer holder 130. Any combination of features of the test wafer holder 130 may be implemented in connection with the test wafer holders 108, 122 described above. The test wafer holder 130 may be positioned to enable a test wafer to capture a metal deposition that correlates with a metal deposition on a production wafer positioned in a wafer holder, such as a dome, without impeding deposition of the production wafer positioned in the wafer holder as also described above. The test wafer holder 130 may be made of stainless steel, aluminum, copper, chromium, or other suitable metals.

FIG. 5A shows a side view of the test wafer holder 130. The test wafer holder 130 may have a height h1, which may approximate the distance of a test wafer from a shaper. A top surface 132 of the test wafer holder 130 may be separated from the shaper by the thickness of a cross beam, which may be approximately 20 mm. The height h1 of the test wafer holder may be selected to be large enough such that a wafer may easily be positioned in the test wafer holder 130, while being small enough to prevent the test wafer holder 130 from substantially interfering with deposition onto production wafers positioned in a separate wafer holder, such as a dome. Yet some interference may be tolerated in certain applications. In some implementations, the height h1 of the test wafer holder may be approximately 20 mm to 40 mm, for example. The height h1 can be selected to allow sufficient room for manual loading and unloading of the test wafer with a wafer vacuum wand or other implement.

The test wafer holder 130 may include the top surface 132 that may be attached to the cross beam within an evaporation chamber through a center hole ranging from approximately 4 mm to 8 mm in diameter. A thickness h2 of the top surface 132 of the test wafer holder 130 may be approximately 2 mm to 8 mm. As illustrated in FIG. 5A, the test wafer holder 130 may include a plurality of posts 134 that can connect the top surface 132 of the wafer holder 130 to a bottom portion of the test wafer holder 130. In some implementations, a thickness h3 of the bottom may be approximately 3 mm to 8 mm. The posts 134 may be positioned to allow a wafer to be easily placed in a slot 136 that includes a hole 138 in a bottom portion 140 of the test wafer holder 130. The test wafer holder 130 may have four posts 134 in certain instances. However, any suitable number of posts or other supporting structures can be employed.

FIG. 5B illustrates a top view of the bottom portion 140 of the test wafer holder 130. The bottom portion 140 may include a slot that may have, for example, a hole 138 and a lip or ridge 142 for supporting a test wafer. The test wafer may be placed in the test wafer holder 130 such that a major surface of the test wafer may be in a direct path of a vapor generated by a metal source in an evaporation chamber. In some implementations, the hole 136 may have a width d1 that is smaller than the diameter of a test wafer by approximately 2% to 6% at the widest point and a width d2 from one end of the lip 142 to the other end of the lip 142 may be approximately the same size as the wafer diameter or a few percent larger across the widest point of the hole 136. In such implementations, the width d3 of the bottom portion 140 of the test wafer holder 130 may be approximately 10 mm to 30 mm larger than the wafer diameter at the widest point. The lip 142 may be sized to accommodate a portion of the test wafer that may not be intended to be exposed to the vapor.

As described above, it may be desirable for a footprint of the test wafer holder 130 to be no greater than the footprint of a shaper in the path that vapor travels from a metal source to a production wafer in a wafer holder. Due to the shape of certain shapers, opposing ends 144, 146 of the top 132 and the bottom portion 140 of the test wafer holder 130 may be substantially flattened as illustrated in FIGS. 5A and 5B, instead of continuing a substantially circular shape. For example, a test wafer holder can have a footprint contained within a footprint of a shaper in a direction substantially parallel to a bottom and/or a top of an evaporation chamber. Alternatively or additionally, a test wafer holder may have a footprint contained within a footprint of a shaper along a path that the metal source travels to production wafers. This may allow the test wafer holder to avoid interfering with deposition onto the production wafers.

Figure 6:
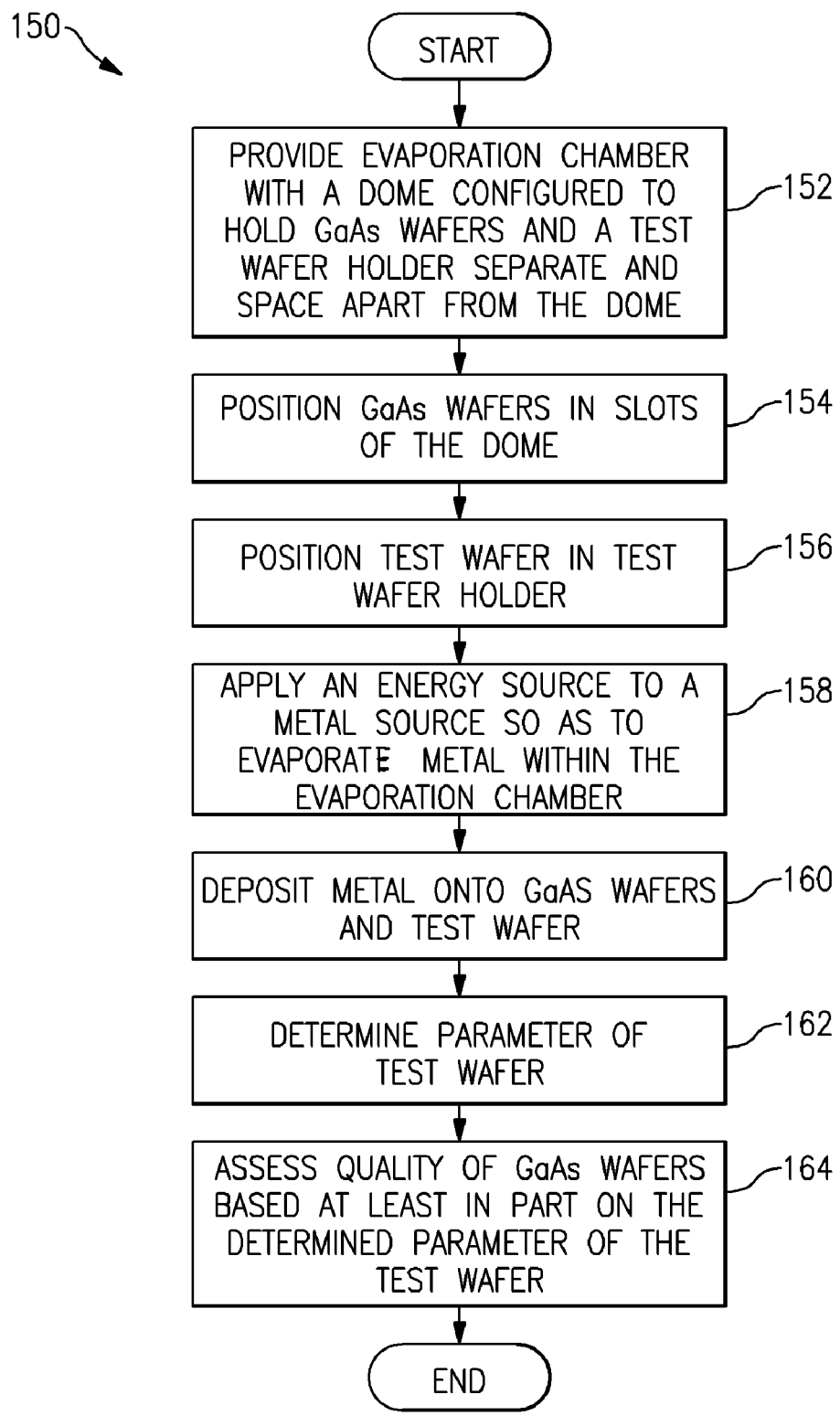
FIG. 6 is a flowchart of a method of processing one or more GaAs wafers using an evaporator, such as the evaporators illustrated in FIGS. 3 and 4, according to an embodiment.

FIG. 6 provides a flowchart of a method 150 of processing one or more semiconductor wafers, such as GaAs wafers. The method 150 may use an evaporator that includes any combination of features of the evaporators described herein, such as the evaporators 100, 120. Any combination of the features of method 150 may be embodied in a non-transitory computer readable medium and stored in non-volatile computer memory. When executed, the non-transitory computer readable media may cause some or all of the method 150 to be performed. It will be understood that the methods discussed herein may include greater or fewer operations and the operations may be performed in any order, as necessary.

The method 150 may begin at block 152 in which an evaporation chamber is provided. The evaporation chamber may include a dome configured to hold a plurality of wafers. In some implementations, the dome is configured to hold wafers having a diameter of at least about 6 inches. These wafers may be held in slots of the dome. The dome may be configured to rotate about an axis substantially perpendicular to major surfaces of a shaper in the evaporation chamber of the evaporator. Alternatively or additionally, dome may be configured to rotate about an axis of a line from a metal source to the center of the dome. The evaporation chamber may also include a test wafer holder separate and/or spaced apart from the dome. In certain implementations, the test wafer holder may be attached to a cross beam below a shaper. In some implementations, the shaper may have a footprint at least as large as a footprint of a test wafer holder in the path metal vapor travels between the metal source and the semiconductor wafer positioned in the dome. This may allow the test wafer to be in a direct path of metal vapor from the metal source during evaporation, without interfering with evaporation onto production wafers positioned in slots of the dome. In other implementations, the footprint of the test wafer holder may be larger than the shaper in the path metal vapor travels between the metal source and the semiconductor wafer positioned in the dome.

Next, one or more semiconductor wafers may be positioned within the evaporation chamber. One or more semiconductor production wafers may also be positioned within the dome at block 154. The one or more semiconductor production wafer may be GaAs wafers. A semiconductor test wafer may be positioned in the test wafer holder at block 156. The positioning actions may be carried out in any sequence or simultaneously. Each of these wafers may have a major surface exposed to a path of vapor traveling from the metal source. This may be accomplished via holes in slots in the dome and/or holes in the test wafer holder. These holes may be sized to expose substantially all of the wafers to metal vapor. An outer ring of the wafers may be blocked from the metal vapor by a lip or ridge around the holes.

Energy, such as heat, may be applied to a metal source at block 158. When energy is applied to the metal source, metal from the metal source may be evaporated into the evaporation chamber. The metal source may include, but is not limited to, titanium, platinum, gold, nickel, copper and/or gold germanium alloy.

Metal may be evaporated onto a semiconductor wafer positioned in the test wafer holder, while evaporating metal onto the semiconductor wafers (e.g., GaAs wafers) positioned in the dome at block 160. This may deposit a thin film of metal over each of the wafers. At least a portion of the thin film of metal may be removed by subsequent processing steps. In a number of implementations, at least a portion of the metal evaporated onto the semiconductor wafer may function as a contact on a HBT device for a collector, a base, and/or an emitter. According to some of these implementations, the device may combine an HBT and FET to create a BiFET device. In other implementations, evaporation may be part of a process of forming functional varactors or gain blocks, pHEMTs, LEDs, solar cells, or other structures.

After metal deposition, one or more parameters of the test wafer may be determined at block 162. Such parameters may be associated with any measurement that may be indicative of quality and/or reliability of structures formed on the wafer. Example parameters may be associated with, among other things, thickness, sheet resistance, uniformity of the metal deposited, stress, and/or particles evaporated. At block 164, a quality and/or reliability assessment of the production semiconductor wafers can be made based at least in part on the one or more parameters determined at block 162. Production wafers that are determined to have a quality and/or reliability that satisfies a predetermined threshold may continue to be processed, and production wafers that are determined to be of a quality that does not satisfy the predetermined threshold may not be shipped to customers. The predetermined threshold may be based at least in part on any combination of the parameters of the test wafers described herein. The predetermined threshold may also be adjusted over time and/or for different end products. For example, the predetermined threshold may depend on a particular application of end products that include at least a portion of a production semiconductor wafer.

Detecting Evaporation Conditions

In addition to using test wafers to assess metal deposition on production wafers, evaporators may also be configured to monitor the progress of evaporation and/or metal deposition, while metal is evaporated in the tightly controlled environment of an evaporation chamber. Some evaporators use crystal monitoring systems to monitor metal deposition. Although the following description provides examples described in connection with crystal monitoring systems, the concepts described may be applied to any other suitable systems and/or methods using other hardware that can monitor conditions of metal deposition. While features related to crystal monitors are described below in connection with an evaporator, the concepts discussed may be applied to a variety of vacuum deposition systems, including without limitation electron beam, sputtering, molecular beam epitaxy (MBE), chemical vapor deposition (CVD) including plasma enhanced CVD, metal organic CVD, photo voltaic CVD, organic light emitting diode (OLED), and/or atomic layer deposition (ALD) processes.

Crystal monitor systems may be included to monitor deposition rates and/or accumulated metal thickness on a wafer. A crystal monitor system may include a crystal monitor sensor coupled to an oscillator and an external monitoring system configured to control the oscillator and obtain measurements associated with the crystal sensor. A crystal oscillates at a resonant frequency that may depend on a thickness and/or a mass of the film deposited onto the crystal. By applying a voltage, for example, via an oscillator, across faces of a suitably shaped piezoelectric crystal, the crystal may be distorted and/or change shape in proportion to the applied voltage. At certain discrete frequencies of applied voltage, a condition of sharp and/or repeatable electro-mechanical resonance may be seen. In some instances, the crystal monitor sensor may include a plurality of inputs. These inputs may be assigned to different materials, averaged for accurate deposition control, and/or configured for a dual sensor. Certain crystal monitor systems may be capable of measuring thickness of less than a single atomic layer with 0.5% accuracy. By measuring a resonant frequency of an oscillating crystal, a thickness of a metal and/or a dielectric coating may be determined within 1 Angstrom, in some instances.

Conventional evaporators may position a crystal monitor sensor near one or more substrates onto which a thin film is deposited. In this way, the crystal monitor sensor may be able to take accurate measurements that closely correspond to material being deposited on the one or more substrates because the crystal monitor sensor may be exposed to a substantially similar environment as a substrate. In response to the crystal monitor system detecting that a desired thickness of material has been deposited on the one or more substrates, a shutter can close so as to block additional vapor from the metal source from being deposited onto the one or more substrates.

Some evaporators may be used to deposit a number of different metal layers onto a substrate. For example, certain evaporators may be used to deposit a thin film of metal over several different features of a substrate during separate processing steps. Various metals may be selected based on how they interact with the materials over which they are formed. In some instances, different metals may be deposited over a collector, a base, and/or an emitter of a bipolar transistor, such as a HBT device, so that the metal may function as a contact. Different metals may also be used in connection with any of the devices described herein, such as BiFETs, pHEMTs, and others. A single evaporator may be used to perform each of these metal depositions. Alternatively or additionally, different metals may also be deposited on the substrate using the single evaporator to form features, including without limitation a source, a gate, and/or a drain of a field-effect transistor and/or interconnects between circuit elements.

When using an evaporator for depositing a plurality of different metal sources onto a substrate, a particular metal source should be placed within the evaporator corresponding to a desired metal to be evaporated onto the substrate. However, in some cases, an incorrect metal is placed within the evaporator. For example, a metal for a base contact may be loaded in the evaporator as a metal source for processing related to forming an emitter contact, instead of a different metal for the emitter contact. If the incorrect metal is deposited on a substrate, the substrate can be damaged, and even ruined. With a crystal monitor sensor positioned near a substrate on which the metal is evaporated, as in some conventional evaporators, the crystal monitor system may not be able to detect which metal source is being evaporated until at least some metal is deposited onto the substrate. At that point, the substrate may already be damaged.

Alternatively or additionally, other conditions related to evaporation may indicate that the evaporation chamber is not working as desired and/or that the metal source should not be deposited onto the wafer. For example, a crystal monitoring system may be used to detect that the metal source includes impurities above a predetermined threshold level. As another example, a melt of the wrong material could be in the pocket, or the wrong material could be added to the correct melt. In addition, the melt may be left out of the crucible pocket entirely. In an electron-beam evaporator, the crystal monitor can also detect a beam intensity strength and/or a beam position in the pocket (e.g., if the beam is properly centered or not). Crystal monitor sensors positioned near substrates may not be able to detect these undesirable conditions, until at least some metal is deposited onto the substrate.

Figure 7A:
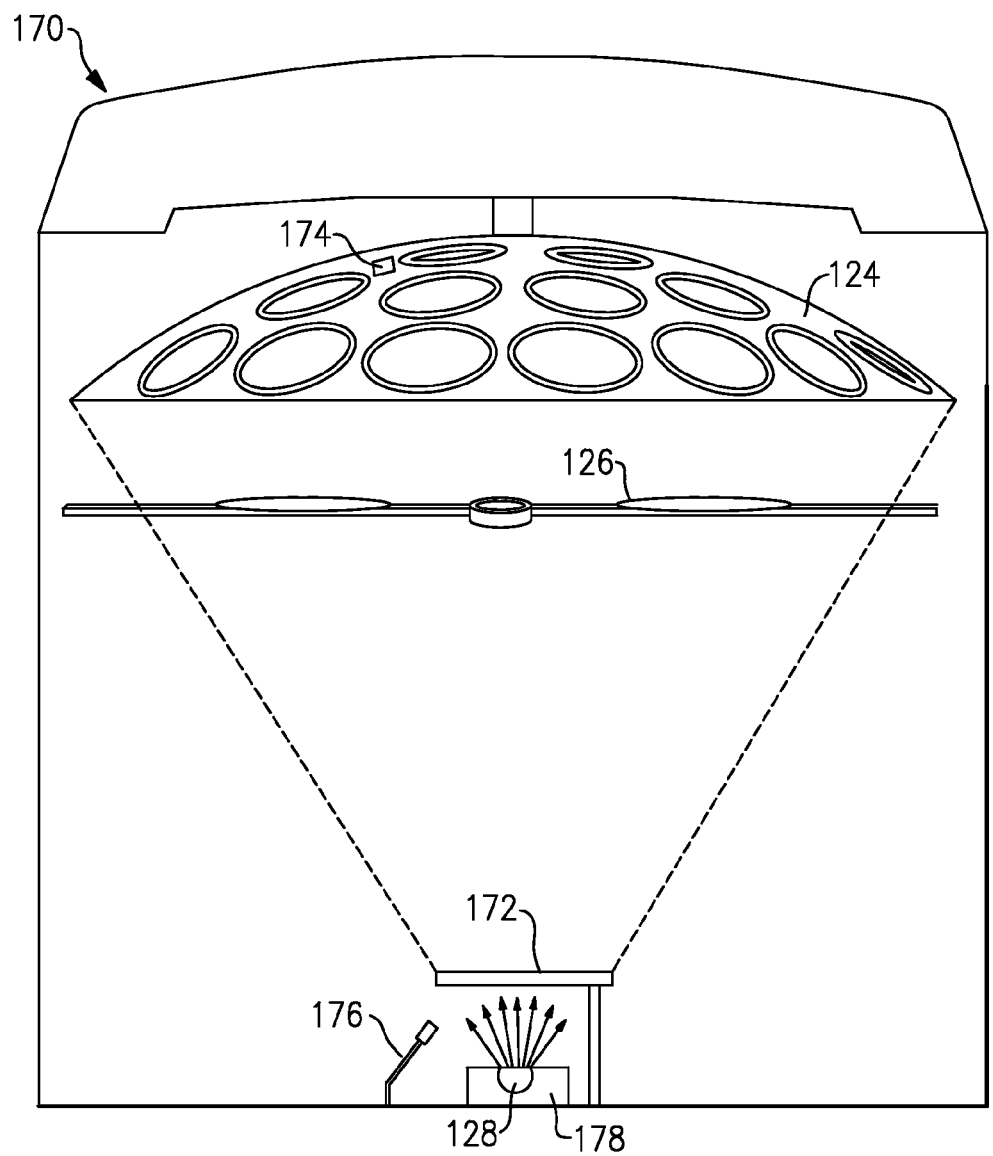
FIGS. 7A and 7B illustrate an evaporator with two crystal monitor sensors according to an embodiment.
Figure 7B:
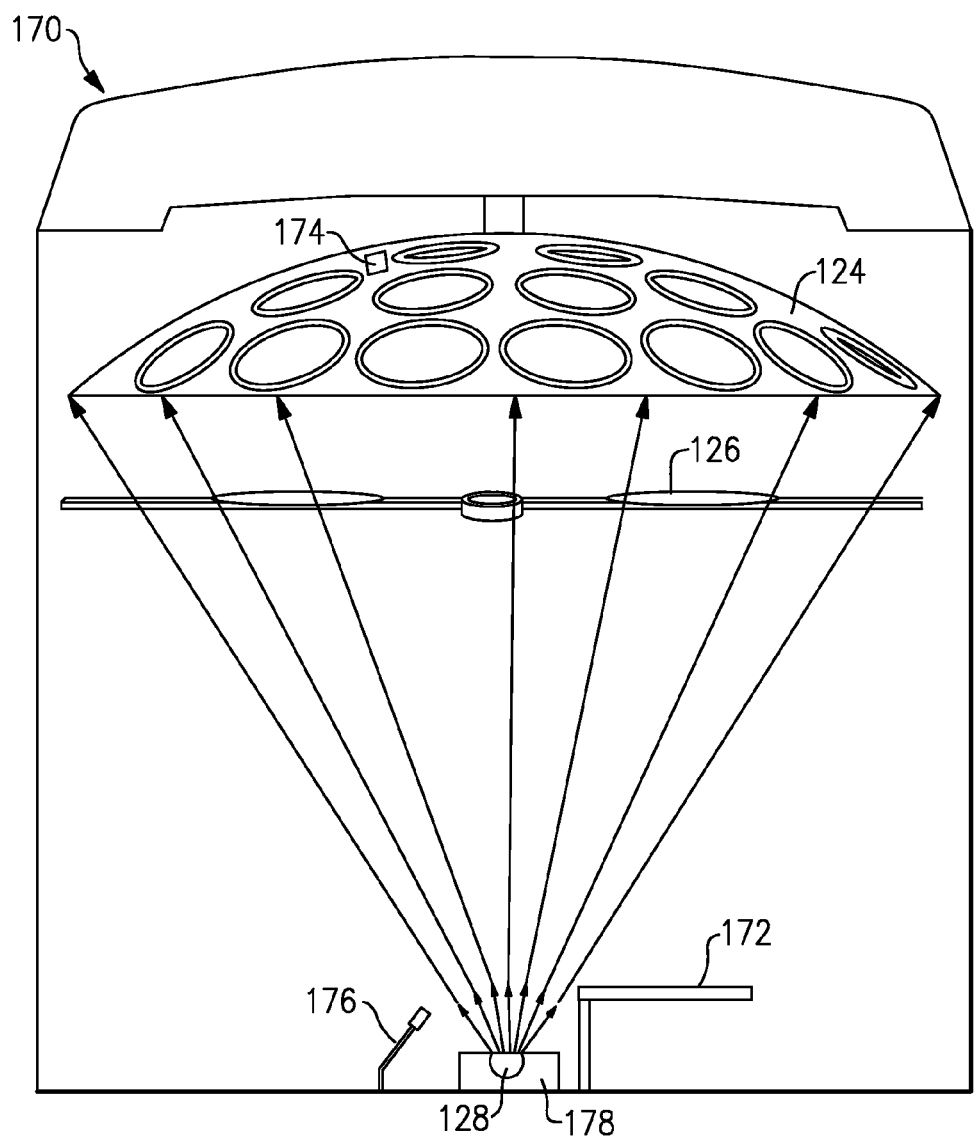

FIGS. 7A and 7B illustrate an evaporator 170 with two crystal monitor sensors according to an embodiment. One of the two crystal monitor sensors may be used to monitor evaporation associated with a metal source before metal from the metal source is deposited onto a substrate, by preventing a shutter from opening under certain conditions. This may be accomplished, for example, by selectively allowing deposition onto the substrate only if certain conditions are detected.

The evaporator 170 can be used, for example, in connection with the process described above in connection with FIG. 1. Any combination of features of the evaporator 170 may be implemented in connection with the evaporators described herein, for example, the evaporators 100, 120. Like the evaporator 120, the evaporator 170 includes a wafer holder 124 shaped as a dome, a metal source 128, and a shaper 126 positioned between a metal source 128 and the wafer holder 124. As shown in FIGS. 7A and 7B, the evaporator 170 can also include a shutter 172, a first crystal monitor sensor 174, a second crystal monitor sensor 176, and a crucible 178.

In FIG. 7A, the shutter 172 is shown in a closed position. The shutter 172 can block vapor from the metal source 128 from being deposited onto a wafer positioned in a slot of the wafer holder 124 when in the closed position. In contrast, FIG. 7B illustrates the shutter 172 in an open position that allows metal from the metal source to be deposited on a wafer positioned within the wafer holder 124. The shutter 172 may be made of any suitable material that can block metal vapor from the metal source. The shutter 172 may also be any suitable shape that can block metal vapor from traveling from the metal source to one or more substrates on the wafer holder 124.

The shutter 172 may close in response to the first crystal monitor sensor 174 detecting a condition indicating that a suitable thin film has been deposited on one or more substrates positioned within slots of the wafer holder 124. For instance, the first crystal monitor sensor 174 may detect that a thickness of metal deposited onto one or more substrates positioned in the wafer holder 124 have reached a desired thickness, and then the shutter 172 may close. The first crystal monitor sensor 174 may be positioned within the evaporation chamber such that the first crystal monitor sensor 174 observes substantially similar conditions to the one or more substrates positioned in slots of the wafer holder 124. For example, the first crystal monitor sensor 174 may be positioned in the same plane as the wafer holder 124. For example, a hole may be made in the top of the wafer holder 124 to allow the crystal monitor sensor 174 to be exposed to the metal vapor.

The second crystal monitor sensor 176 may also be included in the evaporation chamber to monitor evaporation conditions before the shutter 172 opens so as to prevent deposition onto one or more substrates positioned in slots of the wafer holder 124 unless certain conditions are met. For instance, as the metal source 128 in the crucible 178 is being heated to ramp up evaporation, the second crystal monitor sensor 176 may detect whether or not the metal source 128 corresponds to a desired metal. This can verify that the correct metal source has been added to the evaporator 170 for a particular processing step. In some instances, the second crystal monitor sensor 176 may receive data at different inputs corresponding to a particular metal source. For example, a first input may correspond to detecting a first metal source and a second input may correspond to a second metal source. Alternatively or additionally, the second crystal monitor sensor 176 may detect a faulty metal source 128 that should not be evaporated onto a wafer. In some cases, the faulty metal source may contain impurities or other defects. Other examples of conditions that can be detected by the second crystal monitor 176 include detecting an incorrect melt within a pocket of the crucible 178, detecting an undesired material added to a correct melt, detecting a position of the melt within the crucible pocket (e.g., the melt may be left out of the crucible pocket entirely). The second crystal monitor 176 can also detect a beam intensity strength and/or if the beam is properly centered or not in the crucible pocket in electron beam evaporators.

The shutter 172 may open only if the second crystal monitor sensor 176 detects a desired condition for evaporation, such as that the correct metal source is being evaporated. This may prevent damage to the one or more wafers on which metal from the metal source is being deposited. In order to perform such monitoring, the second crystal monitor sensor 176 may be positioned such that the second crystal monitor sensor 176 may monitor evaporation conditions when the shutter 172 is closed.

Figure 8A:
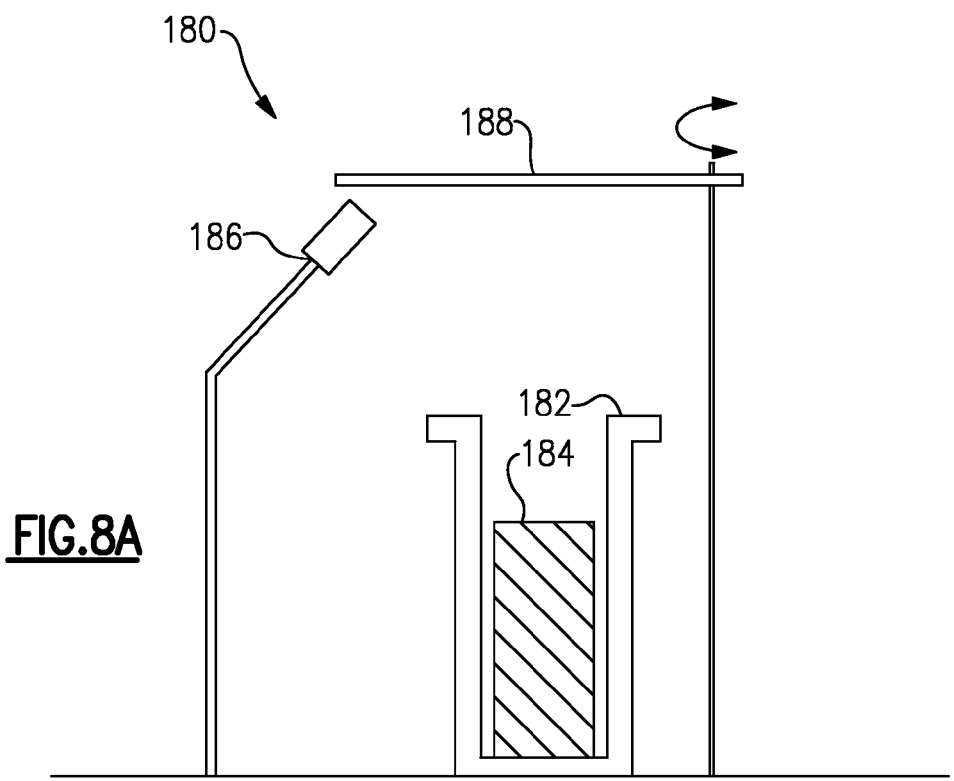
FIG. 8A shows an example shutter system according to an embodiment.

FIG. 8A illustrates a shutter system 180 according to one embodiment. A crucible 182 may hold a metal source 184 to be evaporated in an evaporation chamber. Energy, such as heat, may be applied to the metal source 184 in the crucible 182 in order to heat the metal source 184. The crucible 182 may be made of any suitable material that can withstand the heat directed onto the metal source 184 without sustaining substantial damage. In some embodiments, the crucible 182 may be made of copper. A crystal monitor 186 may be positioned such that a crystal monitor sensor 186 may detect desired conditions for metal evaporation when a shutter 188 is in a closed position. In some implementations, the shutter 188 may create a sealed space for initial evaporation by blocking the opening of the crucible 182 and/or an aperture through which metal vapor travels from the metal source 184 in the crucible 182. This may prevent metal vapor from reaching a substrate in the evaporation chamber onto which metal from the metal source 184 is evaporated.

Figure 8B:
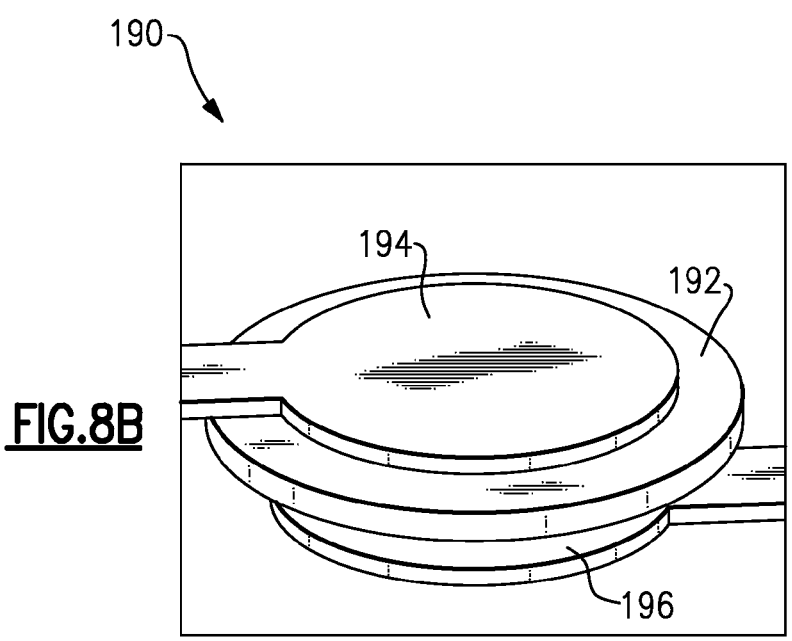
FIG. 8B shows an example crystal monitor sensor according to an embodiment.

FIG. 8B illustrates an example crystal monitor sensor 190. Any of the crystal monitor sensors referenced herein may include any combination of features of the crystal monitor sensor 190. The crystal monitor sensor 190 may include a relatively thin crystal 192 positioned between two electrodes 194, 196. As illustrated in FIG. 8B, the crystal 192 may substantially have a shape of a disc with the two electrodes 194, 196 physically and electrically contacting two opposite major surfaces of the crystal 192. In some instances the crystal 192 may be quartz. In other instances, the crystal 192 may include without limitation gallium phosphate ($GaPO_4$), langasite, and/or langatite. The electrodes 194, 196 may be made of gold, silver, aluminum, and/or other electrically conductive materials. Current and/or voltage signals may be applied to the electrodes 194, 196 in order to monitor conditions related to deposition. For example, such signals may be generated by an oscillator.

Figure 9:
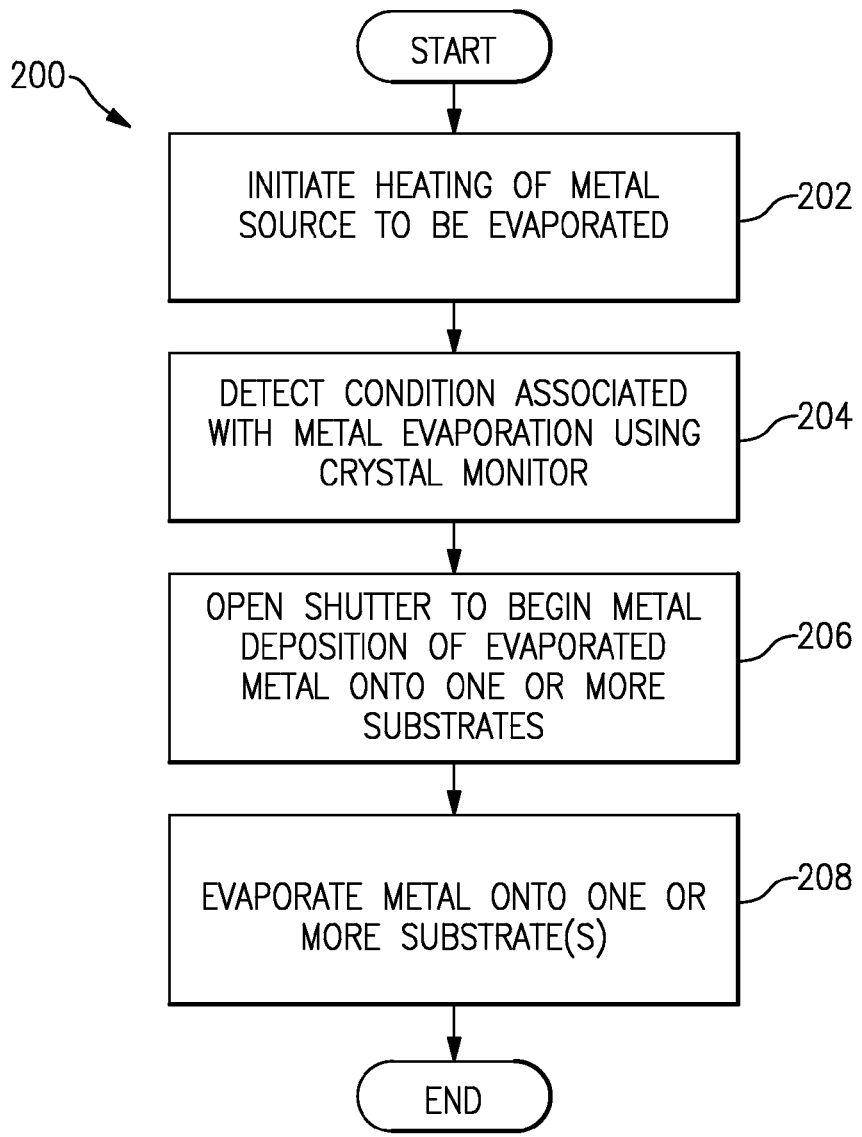
FIG. 9 is a flowchart of a method of depositing method onto a wafer through evaporation according to an embodiment.

FIG. 9 is a method flowchart for a process 200 for monitoring evaporation conditions according to one embodiment. The process 200 may be implemented using an evaporator that includes any combination of features of the evaporators described herein, such as the evaporators 100, 170. Any combination of the features of the process 200 may be embodied in a non-transitory computer readable medium and stored in non-volatile computer memory. When executed, the non-transitory computer readable media may cause some or all of the process 200 to be preformed. The process 200 may begin by initiating heating of a metal source at block 202. Energy can be applied to the metal source via any of the methods described herein. This may cause at least a portion of the metal source to evaporate.

While evaporation is ramping up, a sensor may detect for undesired conditions at block 204. The sensor may be any of the crystal monitor sensors referenced herein. The undesired conditions may include any condition that indicates that the evaporator is not properly configured to deposit a thin film onto one or more substrates. The undesired conditions may be associated with any of the conditions mentioned herein. For instance, at least one of the undesired conditions may be associated with a deposition rate and/or a property of the metal source, such as a composition characteristic or impurity level of the source.

Next, at block 206, a shutter may be opened. This can allow metal from the metal source to travel through the evaporation chamber to one or more substrates positioned on a substrate holder. Until the shutter is opened, metal vapor may be blocked from reaching the one or more substrates on the substrate holder. Thus, metal deposition on the one or more substrates may begin when the shutter is opened. In some instances, the shutter may be opened only if an undesired condition is not detected.

Metal may be evaporated onto the one or more substrates at block 208. This may deposit a thin film of metal onto the one or more substrates. The thin film may cover any of the features of the one or more substrates described herein. At least a portion of the deposited metal may function as, for example, a contact, a metal interconnect, and/or a gate. The one or more substrates may include one or more GaAs wafers or any other substrates mentioned herein. The substrates may have a diameter of at least 6 inches.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A semiconductor processing apparatus comprising:
    a wafer holder configured to hold a plurality of wafers, the wafer holder positioned within a chamber;
    a test wafer holder configured to hold at least one wafer, the test wafer holder positioned within the chamber separate and spaced apart from the wafer holder; and
    a heat source configured to heat a metal source so as to evaporate metal within the chamber onto a plurality of semiconductor wafers positioned in the wafer holder and a test wafer positioned in the test wafer holder.

2. The apparatus of claim 1, wherein the wafer holder is configured to hold at least one GaAs wafer having a diameter of at least about 150 mm.

3. The apparatus of claim 1, wherein the test wafer holder is configured to hold a wafer having a thickness of no greater than about 800 µm.

4. The apparatus of claim 1, further comprising a shaper supported by a cross beam, wherein the test wafer holder is coupled to the cross beam.

5. The apparatus of claim 4, wherein the test wafer holder is positioned between the material being evaporated and the shaper.

6. The apparatus of claim 4, wherein the test wafer holder comprises a top and a bottom portion spaced by a plurality of posts, the bottom porting having a hole surrounded by a ridge, the ridge configured to hold the test wafer.

7. The apparatus of claim 1, wherein the wafer holder comprises a dome.

8. The apparatus of claim 7, wherein the dome is configured to rotate.

9. The apparatus of claim 1, wherein the metal source comprises at least one of gold, gold germanium alloy, platinum, titanium, nickel, and copper.

10. The apparatus of claim 1, wherein the apparatus is configured to process at least one GaAs wafer including at least a portion of a HBT device.

11. The apparatus of claim 10, wherein the apparatus is configured to process at least one GaAs wafer including at least a portion of a BiFET device.

12. The apparatus of claim 1, wherein the apparatus is configured to process at least one semiconductor wafer including at least a portion of at least one of a varactor, a gain block, and a pseudomorphic high electron mobility transistor (pHEMT) device.

13. The apparatus of claim 1, further comprising:
    a crystal monitor configured to detect metal vapor associated with a metal source prior to a portion of metal from the metal source being deposited on at least one wafer in the chamber; and
    a shutter configured to remain in a closed position in response to the crystal monitor detecting a condition, so as to prevent metal deposition on one or more wafers in the chamber.

* * * * *